US012628627B2

(12) United States Patent
Kang et al.

(10) Patent No.: US 12,628,627 B2
(45) Date of Patent: May 12, 2026

(54) FORKSHEET FIELD EFFECT TRANSISTOR INCLUDING SELF-ALIGNED GATE

(71) Applicant: INTERNATIONAL BUSINESS MACHINES CORPORATION, Armonk, NY (US)

(72) Inventors: Tsung-Sheng Kang, Ballston Lake, NY (US); Junli Wang, Slingerlands, NY (US); Alexander Reznicek, Troy, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 299 days.

(21) Appl. No.: 18/057,947

(22) Filed: Nov. 22, 2022

(65) Prior Publication Data
US 2024/0170331 A1 May 23, 2024

(51) Int. Cl.
*H01L 21/768* (2006.01)
*H10D 30/01* (2025.01)
(Continued)

(52) U.S. Cl.
CPC ..... *H01L 21/76897* (2013.01); *H10D 30/014* (2025.01); *H10D 30/43* (2025.01); *H10D 30/6735* (2025.01); *H10D 30/6757* (2025.01); *H10D 62/121* (2025.01); *H10D 64/01* (2025.01); *H10D 64/017* (2025.01); *H10D 84/0167* (2025.01); *H10D 84/0181* (2025.01);
(Continued)

(58) Field of Classification Search
None
See application file for complete search history.

(56) References Cited

U.S. PATENT DOCUMENTS

| | | | |
|---|---|---|---|
| 9,614,056 B2 | 4/2017 | Xie et al. | |
| 11,164,942 B1 | 11/2021 | Weckx et al. | |

(Continued)

OTHER PUBLICATIONS

Greene, "Gate-Cut-Last in RMG to Enable Gate Extension Scaling and Parasitic Capacitance Reduction", IEEE Xplore, 2019 Symposium on VLSI Technology Digest of Technical Papers, 2p.

(Continued)

*Primary Examiner* — Kyoung Lee
(74) *Attorney, Agent, or Firm* — CANTOR COLBURN LLP; Kristofer Haggerty

(57) ABSTRACT

A method of fabrication a semiconductor device includes forming a stack of semiconductor nanosheets on a semiconductor substrate, and performing a nanosheet fin reveal cut process that etches the stack of semiconductor nanosheets to from a first nanosheet fin and a second nanosheet fin. The first and second nanosheet fins are separated by one another by a distance defining an isolation region. The method further includes forming an isolation wall in the isolation region, where the isolation wall extends continuously from a wall based contacting the semiconductor substrate to an opposing wall upper surface. The method further includes forming an electrically conductive gate stack that surrounds the first nanosheet fin, the second nanosheet fin, and the isolation wall, and forming a gate interlayer dielectric (ILD) on an upper surface the electrically conductive gate stack such that the wall upper surface contacts the gate ILD.

20 Claims, 14 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/85* | (2025.01) |

(52) U.S. Cl.
CPC ..... *H10D 84/0186* (2025.01); *H10D 84/0188* (2025.01); *H10D 84/038* (2025.01); *H10D 84/85* (2025.01)

(56)  References Cited

U.S. PATENT DOCUMENTS

| | | |
|---|---|---|
| 2019/0139830 A1 | 5/2019 | Xie et al. |
| 2020/0152734 A1* | 5/2020 | Frougier ............ H10D 84/0151 |
| 2021/0210489 A1 | 7/2021 | Zhang et al. |
| 2021/0296313 A1 | 9/2021 | Lin et al. |
| 2022/0028899 A1 | 1/2022 | Chen et al. |
| 2022/0122895 A1 | 4/2022 | Chan et al. |
| 2022/0231020 A1 | 7/2022 | Frougier et al. |

OTHER PUBLICATIONS

Jones, "VLSI Technology Symposium—Imec Forksheet", IC Knowledge LLC, SemiWiki, Jul. 6, 2021, 6p.
Weckx, "Novel forksheet device architecture as ultimate logic scaling device towards 2nm", IEEE Xplore, 2019, 4p.

* cited by examiner

Top View (X-direction)

(X-direction)

(X-direction)

Y-direction

X-direction

Y-direction

X-direction

X2-direction

X2-direction

X2-direction

X2-direction

Y-direction

X1-direction

FORKSHEET FIELD EFFECT TRANSISTOR INCLUDING SELF-ALIGNED GATE

BACKGROUND

The present invention generally relates to fabrication methods and resulting structures for semiconductor devices, and more specifically, to processing methods and resulting structures for forksheet field effect transistors (FETs).

Nanosheet field effect transistors (FETs) are an emerging technology which may provide solutions to field effect transistor (FET) scaling problems at, and below, the 7 nm node. Nanosheet FET structures may include a plurality of sheets gated on at least two sides of each of the semiconductor fins, as well as a source region and a drain region adjacent to the fin on opposite sides of the gate. FET structures having n-type source and drain regions may be referred to as nFETs, and FET structures having p-type source and drain regions may be referred to as pFETs.

This need to further minimize N-P spacing has motivated a particular type of nanosheet FET referred to as a "fork-sheet" FET. The typical forksheet FET process effectively de-tunes the fin etch process and allows for creating a sub-20 nm gap between device fins. The gap is then filled with a dielectric material such as silicon nitride, for example, which forms an isolation wall or dielectric bar that serves as an insulator and etch stop between the N-type and P-type devices.

SUMMARY

Various non-limiting embodiments of the invention provide a method of fabrication a semiconductor device. The method includes forming a stack of semiconductor nanosheets on a semiconductor substrate, and performing a nanosheet fin reveal cut process that etches the stack of semiconductor nanosheets to from a first nanosheet fin and a second nanosheet fin. The first and second nanosheet fins are separated by one another by a distance defining an isolation region. The method further includes forming an isolation wall in the isolation region, where the isolation wall extends continuously from a wall based contacting the semiconductor substrate to an opposing wall upper surface. The method further includes forming an electrically conductive gate stack that surrounds the first nanosheet fin, the second nanosheet fin, and the isolation wall, and forming a gate interlayer dielectric (ILD) on an upper surface the electrically conductive gate stack such that the wall upper surface contacts the gate ILD.

According to another non-limiting embodiment, a method of fabricating a semiconductor device comprises forming a stack of semiconductor nanosheets on a semiconductor substrate, and performing a nanosheet fin reveal cut process that etches the stack of semiconductor nanosheets to from a first nanosheet fin and a second nanosheet fin. The first and second nanosheet fins are separated by one another by a distance defining an isolation region. The method further comprises forming an isolation wall in the isolation region. The isolation wall extends continuously from a wall based contacting the semiconductor substrate to an opposing wall upper surface. The method further comprises forming a sacrificial gate stack that surrounds the first nanosheet fin, the second nanosheet fin, and the isolation wall. The method further comprises etching a portion of the sacrificial gate stack and the isolation wall such the a wall upper surface is below an upper surface of the sacrificial gate stack, and replacing the sacrificial gate stack with an electrically conductive gate stack. The electrically conductive gate stack includes a shared gate region between the wall upper surface and an upper surface of the electrically conductive gate.

According to another non-limiting embodiment, a semiconductor device comprises a first stack of nanosheet channels on a semiconductor substrate and a second stack of nanosheet channels on the semiconductor substrate. An isolation wall is interposed between the first stack of nanosheet channels and the second stack of nanosheet channels. The isolation wall separates the first and second stacks of nanosheet channels and extends continuously from a wall based contacting the semiconductor substrate to an opposing wall upper surface. The semiconductor device further includes an electrically conductive gate stack that surrounds the first stack of nanosheet channels, the second stack of nanosheet channels, and the isolation wall. A gate interlayer dielectric (ILD) is on an upper surface the electrically conductive gate stack and contacts the wall upper surface of the isolation wall.

Various non-limiting embodiments of the invention provide a semiconductor device including an isolation wall having a first end contacting the substrate and an opposing second end directly contacting an interlayer dielectric (ILD).

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1B:
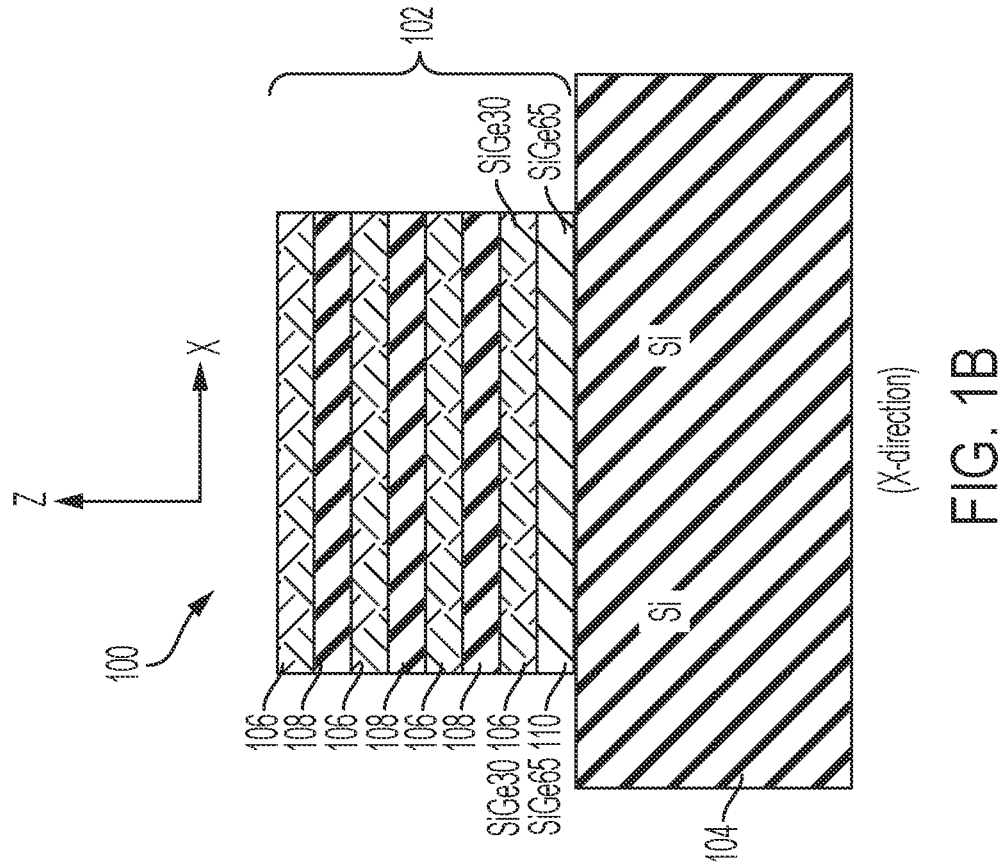
FIG. 1B is a cross-sectional view of the semiconductor device shown in FIG. 1A taken along line X-X.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, known forksheet FET fabrication processes form an isolation region following the fin reveal etch. The isolation region is then subsequently filled with a dielectric material and subsequently etched to form the isolation wall, which is used to separate and electrically insulate neighboring the N-type and P-type devices from one another. As trends continue to further reduce forksheet FET scaling, however, the spacing of the isolation region between neighboring the N-type and P-type devices becomes too small to effectively receive the dielectric material and form the isolation wall.

In addition, known forksheet fabrication processes perform a wall etchback that etches portions of the dielectric wall material to define the isolation wall. A subsequent dielectric via (sometimes referred to as a "CT dielectric") is then formed on the upper surface of the isolation wall to establish contact with an upper-level interlayer dielectric and complete the electrical isolation between the N-type and P-type devices. However, the interface between the dielectric via and the upper surface of the isolation wall may be susceptible to promoting undesirable gate leakage current. Furthermore, the reduced thickness of the isolation wall resulting from the reduced isolation region spacing (e.g., isolation region spacings less than 20 nm) causes misalignment of the dielectric via with respect to the upper surface of the isolation wall, causing a portion of the dielectric via to contact the N-type and/or P-type and causing isolation failure and undesirable shorting.

Turning now to an overview of aspects of the present invention, one or more non-limiting embodiments of the invention address the above-described shortcomings by providing fabrication methods and resulting structures for a providing a forksheet FET having a reduced isolation wall region (e.g., that can be scaled below 20 nm) compared to conventional forksheet FETS, while still capable of employing an isolation wall that effectively isolates neighboring the N-type and P-type from one another. In one or more non-limiting embodiments, the isolation wall extends continuously from a wall base that contacts the FET substrate to a wall upper surface that directly contacts the ILD layer. In this manner, the dielectric via (i.e., CT dielectric) not required and can be excluded such that dielectric via misalignment issues (i.e., is self-aligned) and the resulting interface between the dielectric via and isolation wall found in conventional forksheet FETs can be avoided.

Figure 1A:
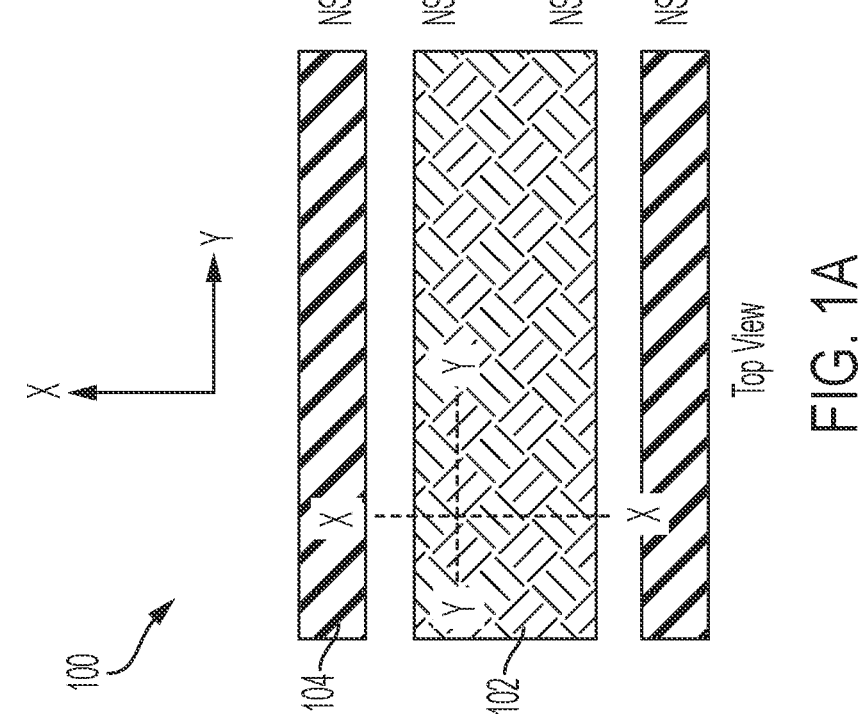
FIG. 1A depicts a top-down view of a semiconductor device following various semiconductor fabrication processes.

Turning now to a more detailed description of fabrication operations and resulting structures according to aspects of the invention, FIGS. 1A and 1B depict an semiconductor device 100 at an intermediate stage of a fabrication process flow according to a non-limiting embodiment of the present disclosure. In the present specification and claims, an "intermediate" semiconductor device is defined as a semiconductor device in a stage of fabrication prior to a final stage. The semiconductor device 100 includes an nanosheet stack 102 formed on an upper surface of a semiconductor substrate 104. The semiconductor substrate 104 extends along a first axis (e.g. X-axis) to define length, a second axis (e.g., Y-axis) orthogonal to the X-axis to define a width, and a third axis orthogonal to the first and second axes to define a height.

The nanosheet stack 102 includes an alternating stack of sacrificial sheets 106 and active sheets 108. In one or more non-limiting embodiments, the active sheets 108 can serve as channel layers as described herein. Although three active sheets 108 are shown, more or fewer active sheets 108 can be used, and the number of sacrificial sheets 106 will be increased or decreased accordingly.

In one or more non-limiting embodiments, the nanosheet stack 102 can include a bottom sacrificial layer 110 interposed between the semiconductor base 104 and a sacrificial sheet 106. The bottom sacrificial layer 110 can later be transformed into a bottom dielectric isolation (BDI) layer, which serves to reduce, or even completely remove, a problem referred to as "half-sheet", which creates a potential leakage path between source and drain regions (not shown in FIGS. 1A and 1B) when the bottom sacrificial layer 110 is omitted.

The bottom sacrificial layer 110 is a material that can be replaced (e.g., etched) without etching the sacrificial sheets 106 and the active sheets 108. In other words, the bottom sacrificial layer 110 is formed from a material that can be replaced without removing the sacrificial sheets 106 and active sheets 108. In one or more non-limiting embodiments, the bottom sacrificial layer 110 includes silicon germanium (SiGe). To facilitate etching of the bottom sacrificial layer 110 without damaging the active sheets 108 and the sacrificial sheets 106, the bottom sacrificial layer 110 can be SiGey % where the atomic percent % for "y" ranges from 50-70% atomic percent, while the sacrificial sheets 106 have a SiGey % of 25%-40%. In an example, "y" in the SiGey % of the layer bottom sacrificial layer 110 can be about (or at least) 65% atomic percent, for example, while "y" in the SiGey % of the sacrificial sheets 106 can be about (or at least) 30% atomic percent such that the bottom sacrificial layer 110 can be etched without etching the sacrificial sheets 106 and the active sheets 108.

In one or more non-limiting embodiments, the sacrificial sheets 106, the active sheets 108, and the bottom sacrificial layer 110 can be epitaxially grown. The material of the active sheets 108 can include, for example, Si. The thickness or height (e.g., along the Z-axis) (e.g., along the Z-axis) of the bottom sacrificial layer 110 can range from about 5 nm to 15 nm, the thickness or height of each sacrificial sheet 106 can range from about 5 nm to 15 nm, and the thickness or height of each active sheet 108 and the can range from about 5 nm to 15 nm.

Epitaxial materials can be grown from gaseous or liquid precursors using, for example, vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on non-crystalline surfaces such as silicon dioxide or silicon nitride.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2B:
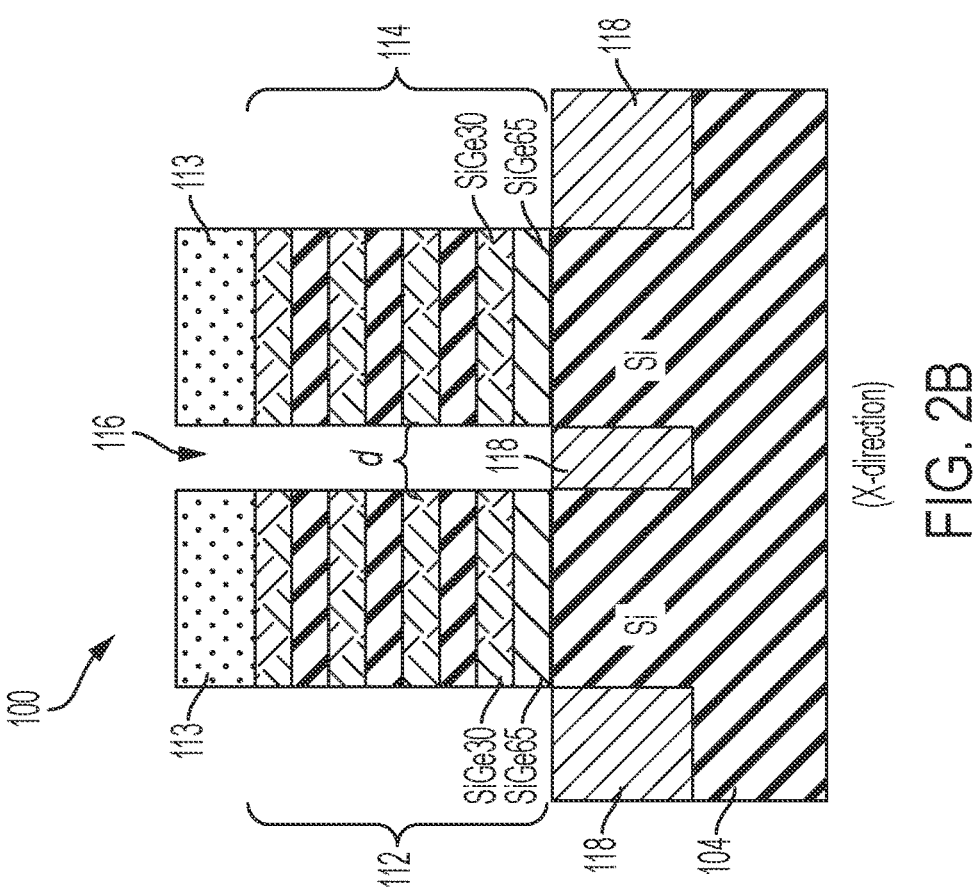
FIG. 2B is a cross-sectional view of the semiconductor device shown in FIG. 2A taken along line X-X.
Figure 2A:
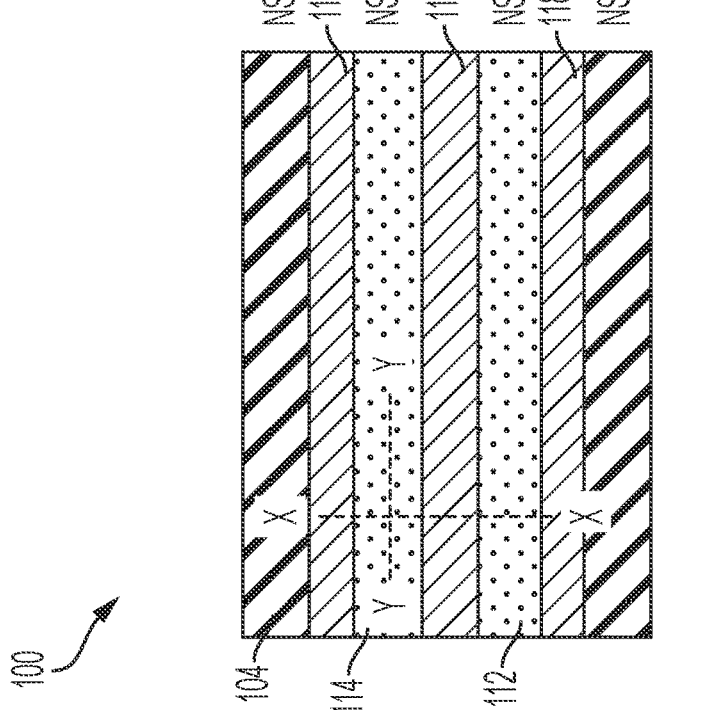
FIG. 2A depicts a top-down view of a semiconductor device following various semiconductor fabrication processes.

Turning now to FIGS. 2A and 2B, the semiconductor device 100 is illustrated following a fin reveal etch process. The fin reveal etch process can include patterning a lithographic mask (e.g., a thick layer of amorphous silicon (aSi)) formed on an upper surface of the nanosheet stack 102 to form individual mask elements that define an opening between one another 103. The pattern (e.g., opening 103) can then be transferred into the exposed nanosheet stack 102 using an reactive ion etch (RIE) process, for example. Accordingly, a first nanosheet fin 112 and a second nanosheet fin 114 are formed on the substrate 104 and are separated from one another by an isolation region 116. The distance (d) (e.g., the width of the isolation region 116) determines a width or thickness of an isolation wall to be formed in the isolation region 116 as described in greater detail below. In one or more non-limiting embodiments, the distance (d) between the first nanosheet fin 112 and the second nanosheet fin 114 (e.g., the width of the isolation region 116) ranges, for example, from about 2 nm to about 15 nm.

In one or more non-limiting embodiments, the first nanosheet fin 112 can be utilized to form a first type of semiconductor device and the second nanosheet fin 114 can be utilized to form a second type of semiconductor device different from the first type of semiconductor device. For example, the first nanosheet fin 112 can be used to form a N-FET while the second nanosheet fin 114 can be used to form a P-FET, or vice versa.

In one or more embodiments, shallow trench isolation (STI) regions 118 can be formed in the substrate 104 and adjacent to the base of the first nanosheet fin 112 and the second nanosheet fin 114. According to an example embodiment, STI regions 118 can be formed from an oxide material (also referred to herein as an "STI oxide") such as silicon oxide (SiOx). Although not explicitly shown in the figures, a liner (e.g., a thermal oxide or silicon nitride (SiN)) may be deposited prior to the STI oxide.

Figures 3A, 3B:
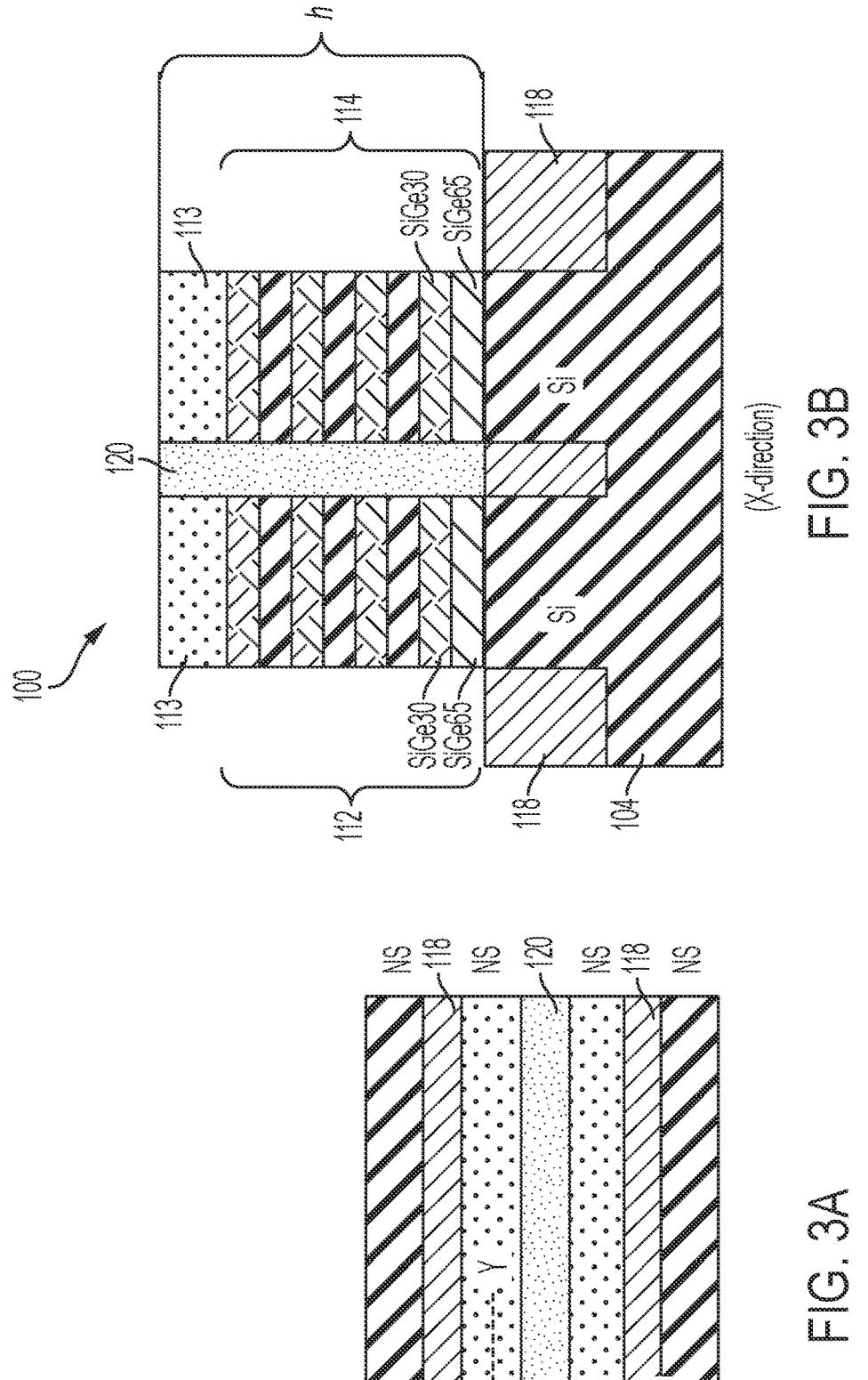
FIG. 3A depicts a top-down view of a semiconductor device following various semiconductor fabrication processes.
FIG. 3B is a cross-sectional view of the semiconductor device shown in FIG. 3A taken along line X-X.

Referring to FIGS. 3A and 3B, the semiconductor device 100 is illustrated following formation of an isolation wall 120 in the isolation region 116. In one or more non-limiting embodiments, the isolation wall 120 is formed by overfilling the isolation region 116 with a dielectric material such as, for example, silicon nitride (SiN). Accordingly, the isolation wall 120 extends continuously (e.g., without an intervening interface) from a wall base that contacts the substrate 104 to an opposing wall upper surface. The distance from the wall base to the wall upper surface defines a height (h) (e.g., extending along the Z-axis) of the isolation wall 120.

In one or more non-limiting embodiments, the dielectric material can be deposited in the isolation region using an atomic layer deposition (ALD) process, for example. Accordingly, the isolation wall 120 can be formed with a height (h) (e.g., along the Z-axis) that is defined by a combination of the height of the first and second nanosheet fins 112 and 114, along with the vertical thickness (e.g., along the Z-axis) of the masking elements 113.

In one or more non-limiting embodiments, a chemical-mechanical planarization (sometimes referred to as a chemical-mechanical polishing) (CMP) process can be performed to recess the masking elements 113 and the isolation wall 120. In this manner, the height (e.g., along the Z-axis) of the isolation wall 120 can be defined and tuned to meet a target height.

Figures 4A, 4B:
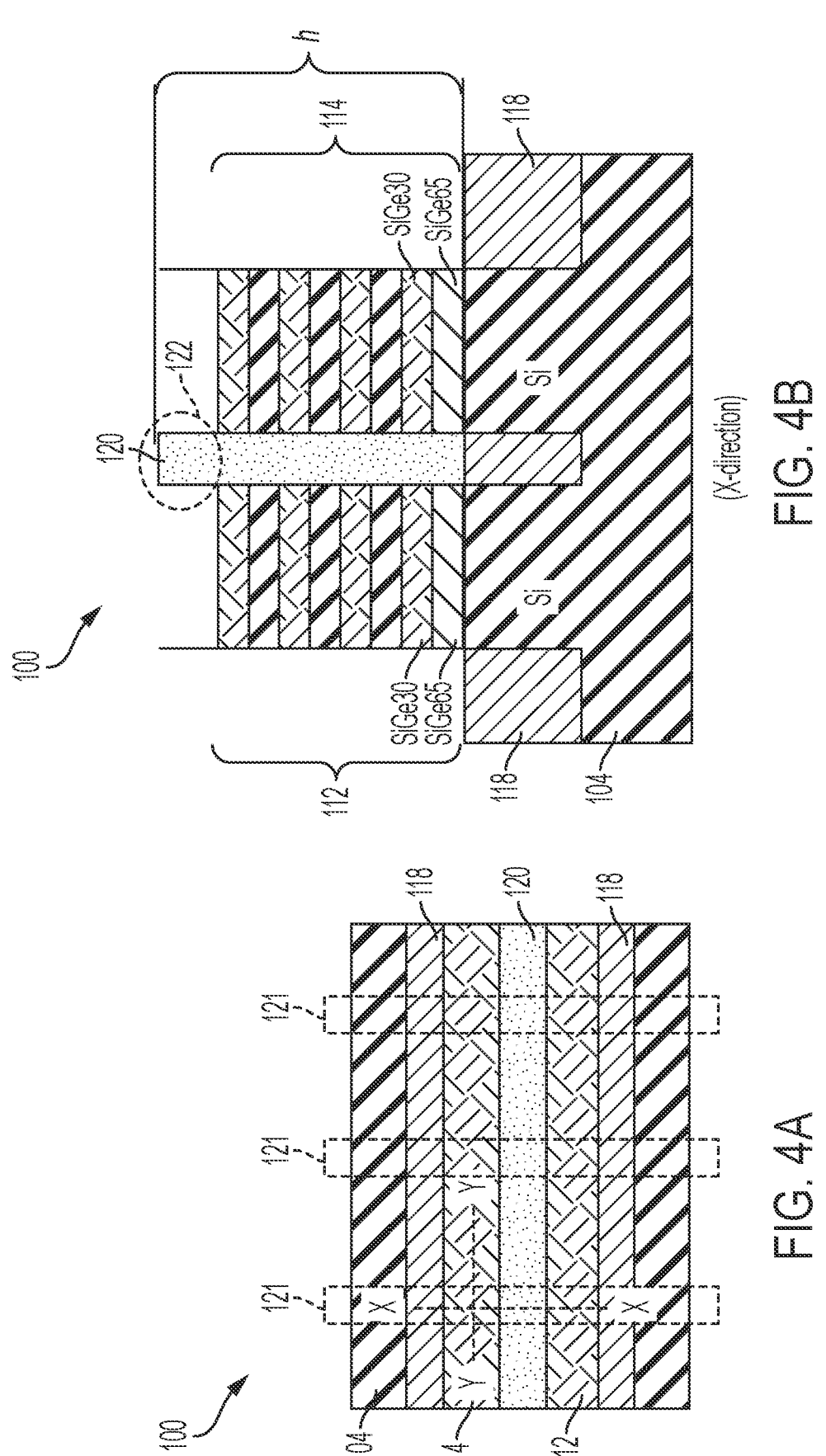
FIG. 4A depicts a top-down view of a semiconductor device following various semiconductor fabrication processes.
FIG. 4B is a cross-sectional view of the semiconductor device shown in FIG. 4A taken along line X-X.

Turning to FIGS. 4A and 4B, the semiconductor device 100 is illustrated after removing the masking elements 113 from the upper surface of the first and second nanosheet fins 112 and 114. The top view of the semiconductor device 100 illustrated in FIG. 4A shows designated gate stack regions 121, which are reserved to support corresponding gate stacks to be formed now that masking elements 113 are removed.

According to one or more non-limiting embodiments, a hydrofluoric acid (HF) chemical etching process can be used to remove masking elements 113 formed from an aSi material. Following removal of the masking elements 113, a protruding portion 122 of the isolation wall 120 extends above the upper surface of the first and second nanosheet fins 112 and 114. The protruding portion 122 of the isolation wall 120 can effectively be utilized to establish contact with a subsequently ILD formed on an upper of the subsequently formed gate structure, as described in greater detail below.

Figure 5:
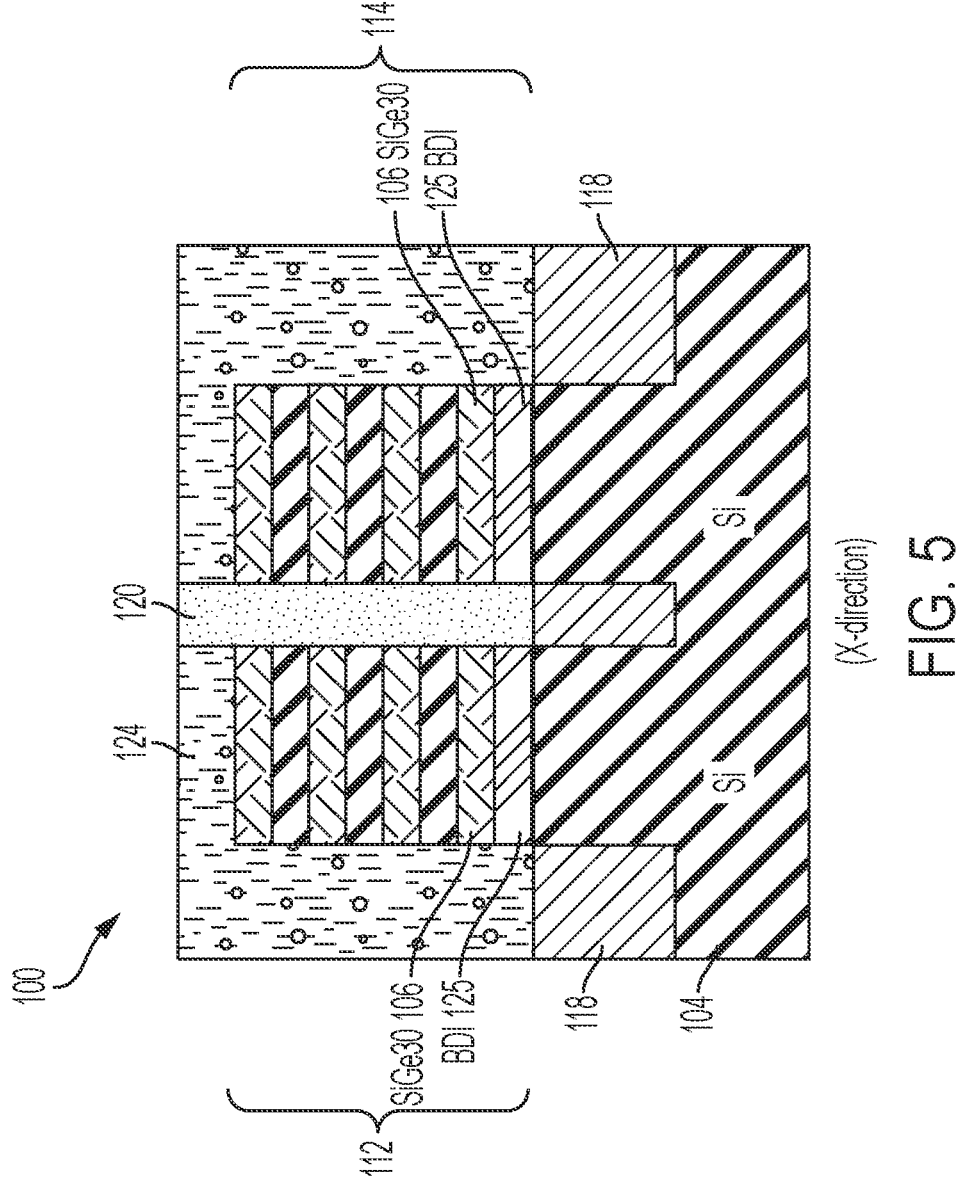
FIG. 5 is a cross-sectional view of the semiconductor device shown in FIG. 4B following various semiconductor fabrication processes.

With reference now to FIG. 5, the semiconductor device 100 is illustrated following the formation of a sacrificial gate stack 124 (sometimes referred to as a "dummy gate stack") over the first and second nanosheet fins 112 and 114. The portion of the first and second nanosheet fins 112 and 114 over which sacrificial gate stack 124 is formed are referred to as channel regions. The sacrificial gate stack 124 can be made of any suitable material, such as, for example, amorphous silicon (aSi) or polysilicon (PC). Any known method for patterning the sacrificial gate can be used, such as, for example, a wet etch, a dry etch, or a combination of sequential wet and/or dry etches.

At this stage of the process flow, a bottom dielectric isolation (BDI) layer 125 can also be formed from the bottom sacrificial layer 110 included in the first and second nanosheet fins 112 and 114. As described herein, bottom sacrificial layer 110 can be replaced with the BDI layer 125 without etching the sacrificial sheets 106 and the active sheets 108 of the first and second nanosheet fins 112 and 114.

With continued reference to FIG. 5, a CMP process can be performed to recess the sacrificial gate sack 124 such that upper surface of the sacrificial gate 124 is flush (i.e., co-planar) with the upper surface of the isolation wall 120. Accordingly, the isolation wall serves as a gate cut (e.g., a CT gate cut, or simply a "CT cut"), which separates and electrically isolates the first nanosheet fin 112 from the second nanosheet fin 114. In other words, the isolation wall 120 separates and electrically isolates the first nanosheet fin 112 and the portion of the sacrificial gate stack 124 covering the first nanosheet fin 112 from the second nanosheet fin 114 and the portion of the sacrificial gate stack 124 covering the second nanosheet fin 114.

Figures 6A, 6B:
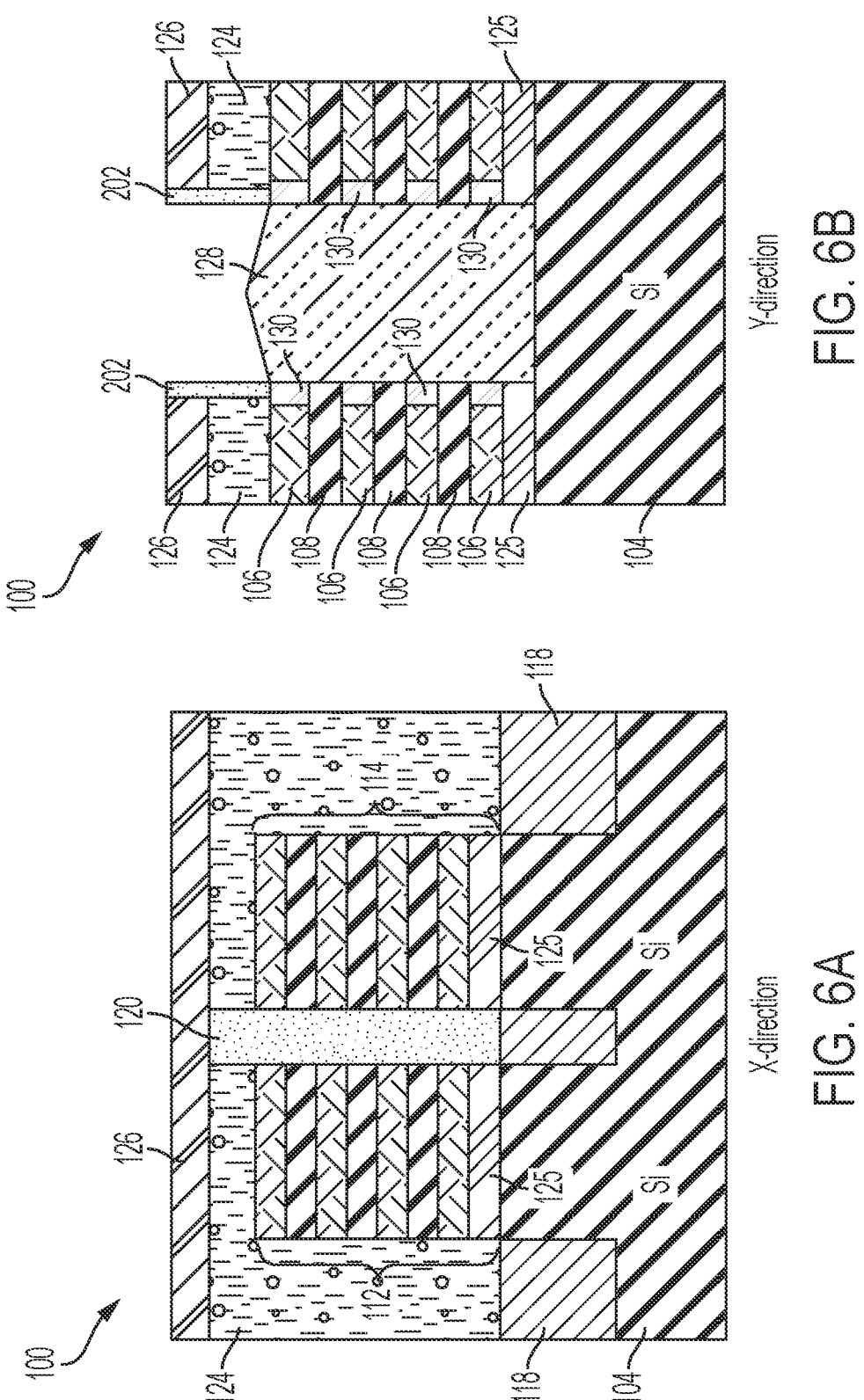
FIG. 6A is a cross-sectional view of the semiconductor device shown in FIG. 5 following various semiconductor fabrication processes.
FIG. 6B illustrates the semiconductor device shown in FIG. 5 in a second orientation taken along line Y-Y shown in FIG. 1A.

Turning to FIGS. 6A and 6B, the semiconductor device 100 is illustrated after forming a hard mask 126 is formed on the sacrificial gate 124. The hard mask 126 can be made of any suitable material, such as, for example, a silicon nitride (SiN). The hard mask 126 can be utilized to preserve the sacrificial gate stack 124 while forming the source/drain regions 128 of the semiconductor device 100 (see FIG. 6B).

With continued reference to FIGS. 6A and 6B, the sacrificial sheets 106 of the first and second nanosheet fins 112 and 114 can be recessed and inner spacers 130 can be formed on the recessed sidewalls of the sacrificial sheets 106. For example, sidewalls of the sacrificial sheets 106 can be recessed to form cavities (not shown) in the first and second nanosheet fins 112 and 114. In some embodiments of the invention, the inner spacers 130 are formed on recessed sidewalls of the sacrificial sheets 106 by filling these cavities with dielectric material. In some embodiments of the invention, portions of the inner spacers 130 that extend beyond sidewalls of the first and second nanosheet fins 112 and 114 are removed, using, for example, by an isotropic etching process. In this manner, sidewalls of the inner spacers 130 are coplanar (e.g., flush) to sidewalls of the active sheets 108. In some embodiments of the invention, the inner spacers 130 are formed using a CVD, PECVD, ALD, PVD, chemical solution deposition, or other like processes in combination with a wet or dry etch process. The inner spacers 130 can be made of any suitable material, such as, for example, a low-k dielectric, a nitride, silicon nitride, silicon dioxide, SiON, SiC, SiOCN, or SiBCN.

In some embodiments of the invention, source and drain regions 128 are formed on exposed sidewalls of the active sheets 108. The source and drain regions 128 can be epitaxially grown using, for example, vapor-phase epitaxy (VPE), molecular beam epitaxy (MBE), liquid-phase epitaxy (LPE), or other suitable processes. The source and drain regions 128 can be semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a Si layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichloroger-mane, tetrachlorogermane and combinations thereof. A sili-con germanium alloy layer can be epitaxially formed utiliz-ing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., P or As) or p-type dopants (e.g., Ga, B, BF2, or Al). In some embodiments of the invention, the source and drain regions 128 can be epitaxially formed and doped by a variety of methods, such as, for example, in-situ doped epitaxy (doped during depo-sition), doped following the epitaxy, or by implantation and plasma doping. The dopant concentration in the doped regions can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$.

As illustrated in FIGS. 6A, and 6B, a semiconductor device 100 can be illustrated having a forksheet FET having a reduced isolation wall region (e.g., that can be scaled below 20 nm) compared to conventional forksheet FETS, while still capable of employing an isolation wall 120 that effectively isolates neighboring first and second nanosheet fins 112 and 114 (e.g., a N-type semiconductor device and a P-type semiconductor device) from one another. In the non-limiting embodiment of the invention shown in FIGS. 6A and 6B, the isolation wall 120 extends continuously from a wall base that contacts the substrate 104 to a wall upper surface, which extends above the upper-most surface of the first and second nanosheet fins 112 and 114. In this manner, the semiconductor device 100 is not required to implement a dielectric via (i.e., CT dielectric) such that dielectric via misalignment issues (i.e., is self-aligned) and the resulting interface between the dielectric via and isolation wall found in conventional forksheet FETs can be avoided.

Figures 7A, 7B:
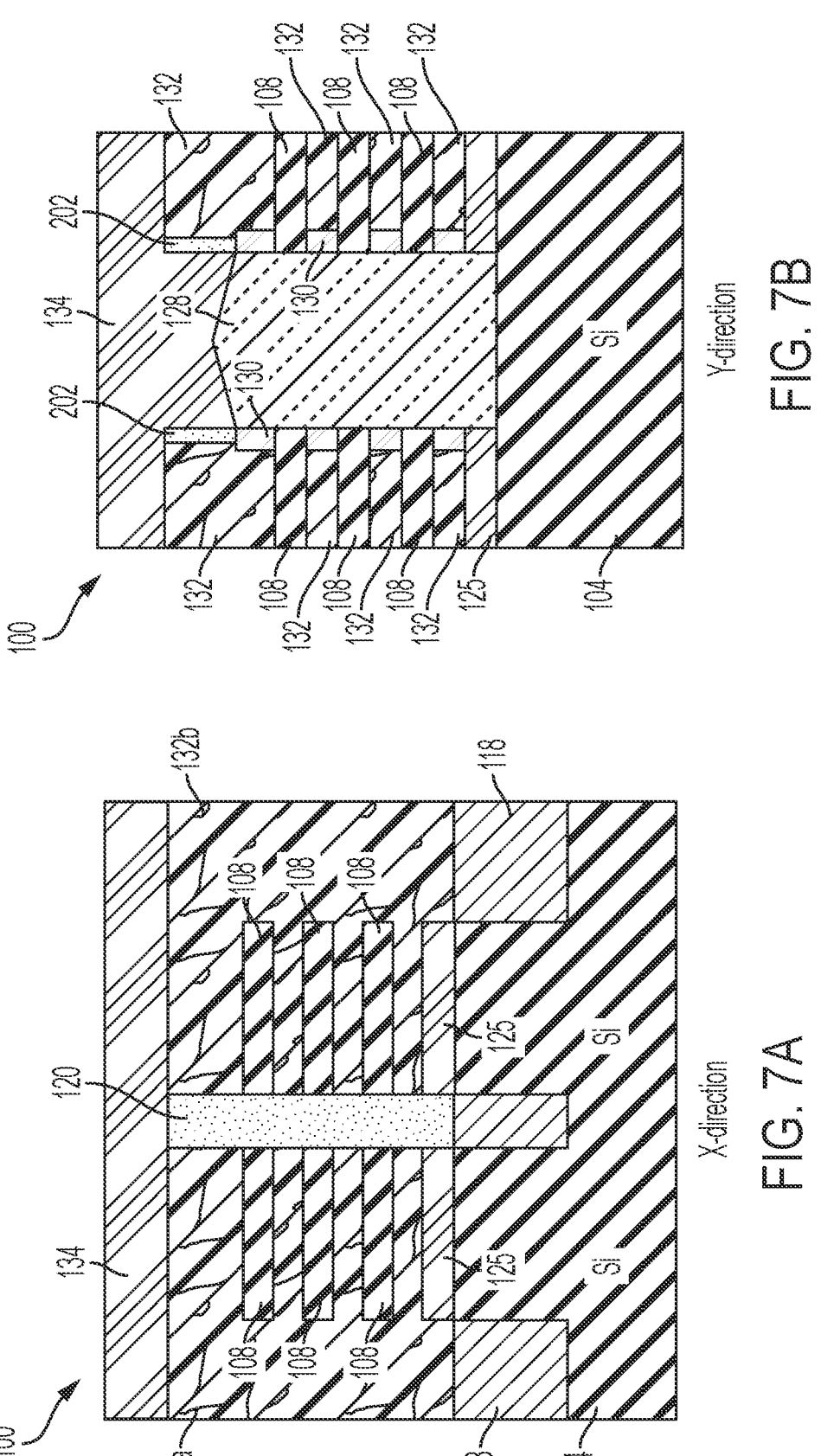
FIG. 7A is a cross-sectional view of the semiconductor device shown in FIG. 5 following various semiconductor fabrication processes.
FIG. 7B illustrates the semiconductor device shown in FIG. 5 in a second orientation taken along line Y-Y shown in FIG. 1A.

With reference to FIGS. 7A and 7B, the semiconductor device 100 is illustrated after performing a replacement metal gate (RMG) process (sometimes referred to as a "gate-first process". The RMG process involves performing various known masking, etching and deposition processes to replace the sacrificial gate 124 with a metal gate 132, e.g., a high-k metal gate (HKMG), which is formed over the channel region of the first and second nanosheet fins 112 and 114.

Prior to performing the RMG process, the active nanosheets 108 are released by removing the sacrificial sheets 106. Once released, the active sheets 108 serve as the channel region of the first and second nanosheet fins 112 and 114. In other words, the active nanosheets 108 retained from the first nanosheet fin 112 forms a first stack of nanosheet channels 108 and the active nanosheets 108 retained from the second nanosheet fin 114 forms a second stack of nanosheet channels 108. In addition, one or more non-limiting embodiments of the invention forms the wall upper surface of the isolation wall 120 above the first and second stacks of nanosheet channels 108.

The sacrificial sheets 106 can be removed from the active sheets 108. For example, when the active nanosheets 108 are formed of silicon and the sacrificial sheets 106 are formed of SiGe, carboxylic acid/nitric acid/HF chemistry, citric acid/ nitric acid/HF, and vapor phased HCl, for example, can be utilized to remove SiGe selective to silicon. In another example, when the active sheets 108 are formed of SiGe and the sacrificial sheets 106 are formed of silicon, aqueous hydroxide chemistry, including ammonium hydroxide and potassium hydroxide, for example, can be utilized to remove silicon selective to SiGe.

With continued reference to FIGS. 7A and 7B, the gate 132 can include a gate dielectric(s) (not shown) and a work function metal stack (not shown). In some embodiments, the gate 132 includes a main body formed from bulk conductive gate material(s).

In some embodiments of the invention, the gate dielectric is a high-k dielectric film formed on a surface (sidewall) of the active sheets 108. The high-k dielectric film can be made of, for example, silicon oxide, silicon nitride, silicon oxyni-tride, boron nitride, high-k materials, or any combination of these materials. Examples of high-k materials include but are not limited to metal oxides such as hafnium oxide, hafnium silicon oxide, hafnium silicon oxynitride, lantha-num oxide, lanthanum aluminum oxide, zirconium oxide, zirconium silicon oxide, zirconium silicon oxynitride, tan-talum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, the gate 132 includes one or more work function layers (sometimes referred to as a work function metal stack) formed between the high-k dielectric film and a bulk gate material. In some embodiments of the invention, the gate 132 includes one or more work function layers, but do not include a bulk gate material.

If present, the work function layers can be made of, for example, aluminum, lanthanum oxide, magnesium oxide, strontium titanate, strontium oxide, titanium nitride, tanta-lum nitride, hafnium nitride, tungsten nitride, molybdenum nitride, niobium nitride, hafnium silicon nitride, titanium aluminum nitride, tantalum silicon nitride, titanium alumi-num carbide, tantalum carbide, and combinations thereof. The work function layer can serve to modify the work function of the gates 132 and enables tuning of the device threshold voltage. The work function layers can be formed to a thickness of about 0.5 to 6 nm, although other thick-nesses are within the contemplated scope of the invention. In some embodiments of the invention, each of the work function layers can be formed to a different thickness. In some embodiments of the invention, the work function layers include a TiN/TiC/TiCAl stack.

In some embodiments, the gate 132 includes a main body formed from bulk conductive gate material(s) deposited over the work function layers and/or gate dielectrics. The bulk gate material can include any suitable conducting material, such as, for example, metal (e.g., tungsten, titanium, tanta-lum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tung-sten silicide, tungsten nitride, ruthenium oxide, cobalt sili-cide, nickel silicide), conductive carbon, graphene, or any suitable combination of these materials. The conductive gate material can further include dopants that are incorporated during or after deposition.

With continued reference to FIGS. 7A and 7B, the metal gate 132 can be planarized (e.g., using a CMP process) such that the wall upper surface of the isolation wall 120 is co-planar (e.g., flush) with the upper surface of the metal gate 132. Thereafter, a gate ILD 134 is deposited on the upper surface of the metal gate 132. The gate ILD 134 can include any materials known in the art, such as, for example, porous silicates, carbon doped oxides, silicon dioxides, silicon nitrides, silicon oxynitrides, or other dielectric materials. The gate ILD 134 can be formed using any method known in the art, such as, for example, chemical vapor deposition, plasma enhanced chemical vapor deposition, atomic layer deposition, or physical vapor deposition.

The dielectric material of the gate ILD 134 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials.

One example of a material suitable for the low-k materials to form the gate ILD 134 can include silicon oxycarbonitride (SiOCN). Other low-k materials that can also be used for the gate ILD 134 can include fluorine doped silicon dioxide, carbon doped silicon dioxide, porous silicon dioxide, porous carbon doped silicon dioxide, organosilicate glass (OSG), diamond-like carbon (DLC) and combinations thereof.

According to a non-limiting embodiment, the upper surface of the isolation wall 120 contacts the gate ILD 134 without extending therethrough. For example, the isolation wall 120 extends continuously from the wall base to the wall upper surface and stops directly on a lower surface of the gate ILD 134. Accordingly, the upper surface of the isolation wall 120 is located completely beneath the gate ILD 134. In this manner, the isolation wall 120 effectively separates or "cuts" the metal gate 132 into two gate portions 132a and 132b or two individual gates. A first gate 132a controls the channel region of the first nanosheet fin 112 (i.e., the first stack of nanosheet channels 108) and a second gate 132b controls the channel region of the second nanosheet fin 114 (i.e., the second stack of nanosheet channels 108). In this manner, the channel regions 108 of the first and second nanosheet fins 112 and 114 can be controlled independently from one another.

Turning now to FIGS. 8A, 8B, 8C and 8D, a semiconductor structure 200 is illustrated at an intermediate stage of a process flow for forming a first semiconductor device 202 and a second semiconductor device 204 on the same semiconductor substrate 206. According to non-limiting embodiments of the invention, the first semiconductor device 202 and the second semiconductor device 204 can be forksheet FETs.

Figure 8B:
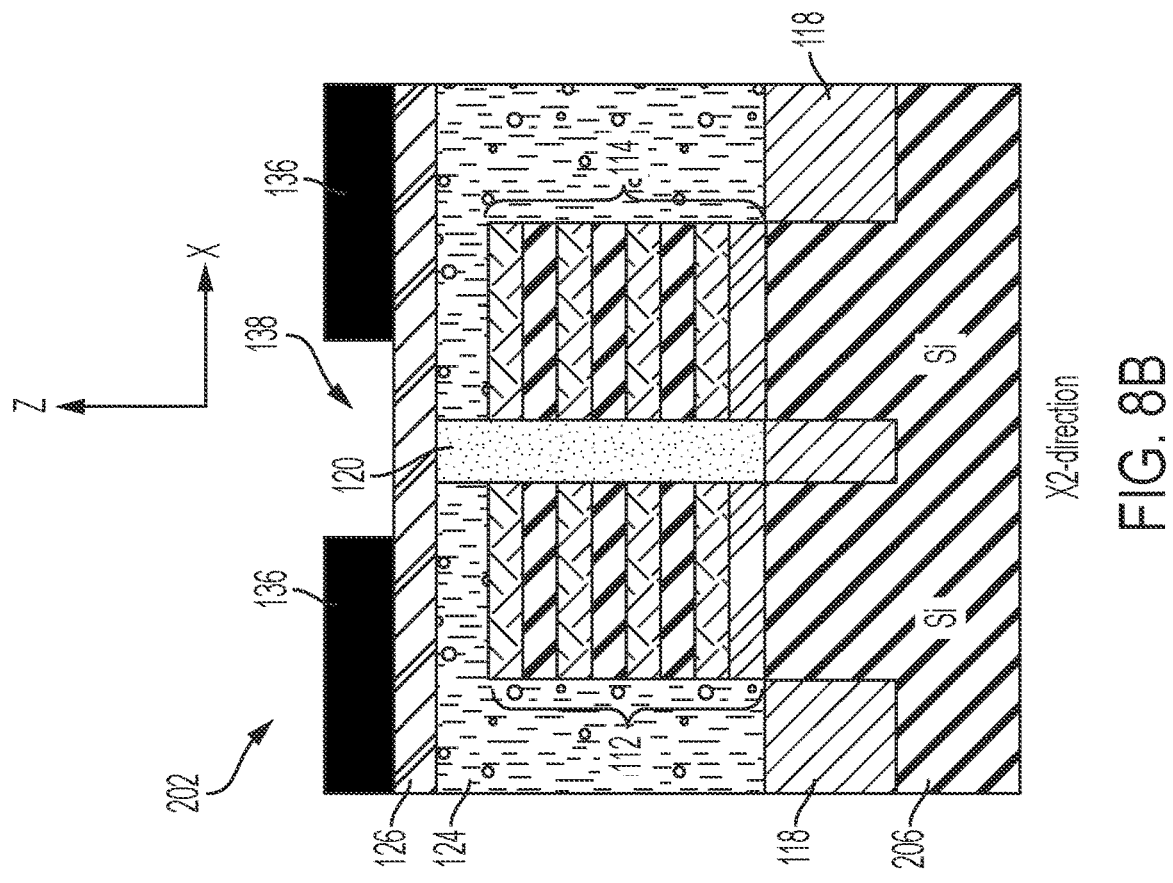
FIG. 8B depicts a cross-sectional view of the second semiconductor device shown in FIG. 8A in a first orientation taken along line X2-X2.
Figure 8A:
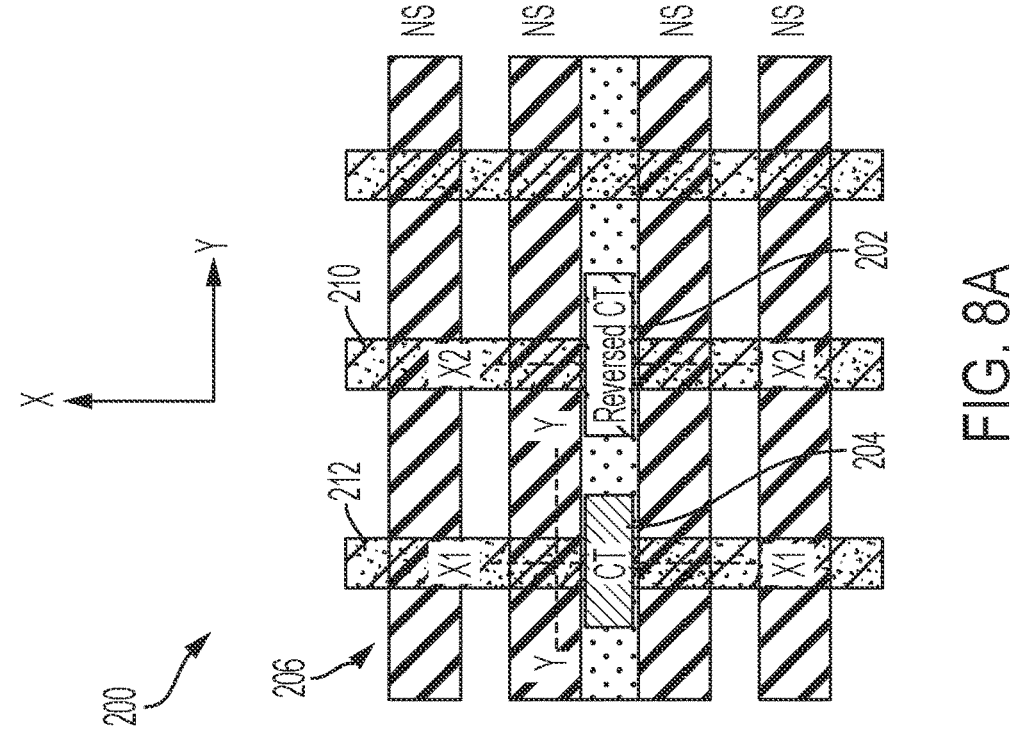
FIG. 8A depicts a top-down view of a semiconductor structure following various semiconductor fabrication processes to form a first semiconductor device and a second semiconductor device.
Figure 8D:
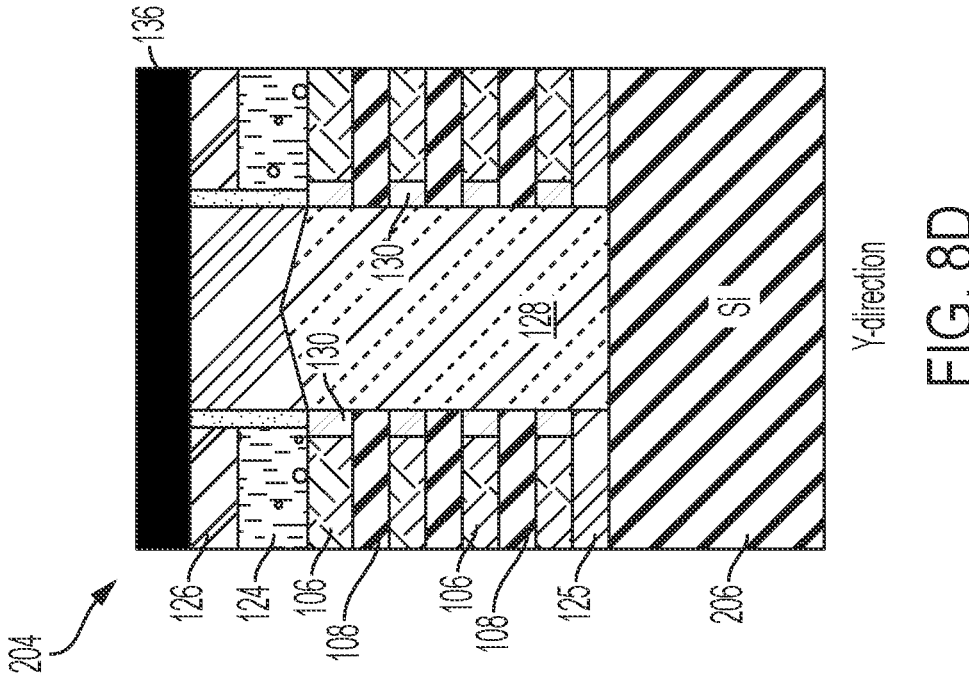
FIG. 8D depicts a cross-sectional view of the first semiconductor device shown in FIG. 8A in a second orientation taken along line Y-Y.
Figure 8C:
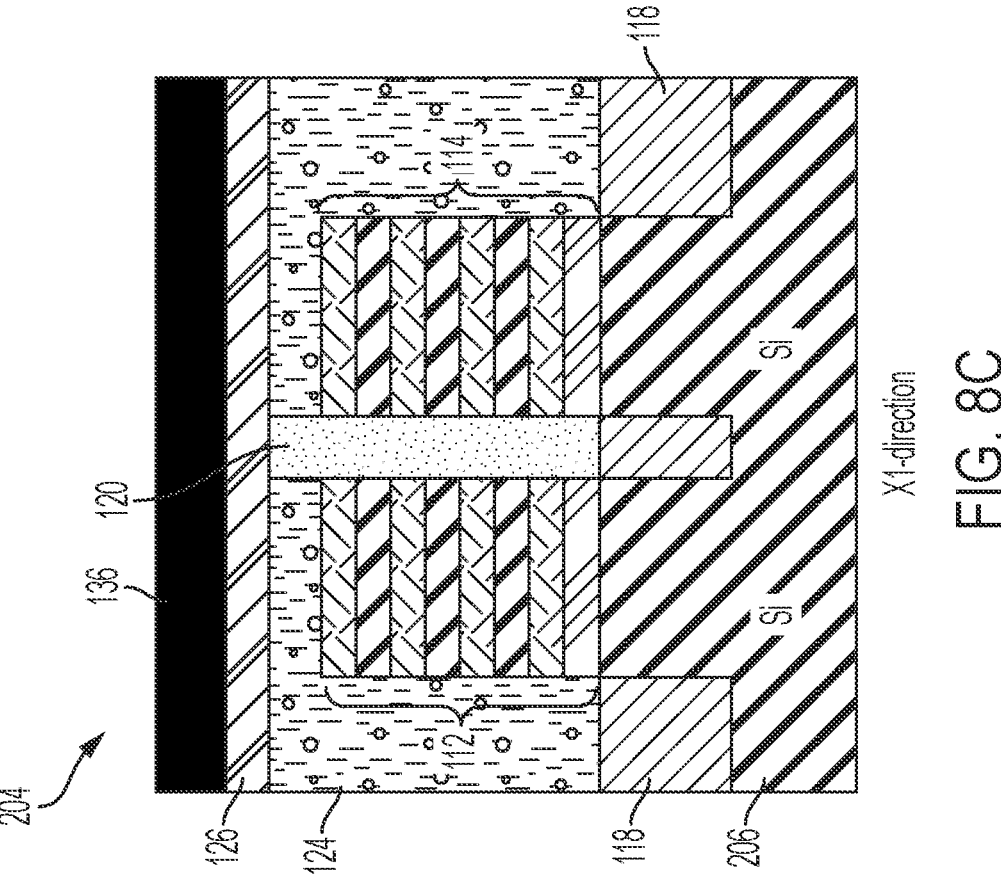
FIG. 8C depicts a cross-sectional view of the first semiconductor device shown in FIG. 8A in a first orientation taken along line X1-X1.

A top-view design layout of the semiconductor structure 200 is illustrated in FIG. 8A. The first semiconductor device 202 is formed at first location of the substrate 206 and includes a first gate stack 210 extending across the channel region along a first axis (X2-X2) in the X-axis direction. The second semiconductor device 204 is formed at second location of the substrate 206 and is separated from the first semiconductor device 202 along the Y-axis. The second semiconductor device 204 includes a second gate stack 212 extending across the channel region along a second axis (X1-X1) in the X-axis direction. In this example, the second semiconductor device 204 is a forksheet FET fabricated according to the process flow described with reference to FIGS. 1-7B above. Accordingly, the resulting first semiconductor device 202 is designed with an isolation wall 120 that "cuts" the metal gate 132 into two gate portions 132a and

132b and allows for controlling the first nanosheet fins 112 (i.e., the first stack of nanosheet channels 108) and the second nanosheet fins 114 (i.e., the second stack of nanosheet channels 108) independently from one another.

With continued reference to FIGS. 8A-8D, the first semiconductor device 202 is fabricated with an isolation wall 120 that allows the first and second nanosheet fins 112 and 114 (i.e., the first and second stacks of nanosheet channels 108) to share the same metal gate 132. To achieve the shared metal gate structure, the isolation wall 120 is fabricated according to a "reverse CT cut" process.

The "reverse CT cut" process includes depositing a lithographic mask 136 on the gate masks 126 of the first and second semiconductor devices 202 and 204. Thereafter, the lithographic mask 136 of the first semiconductor device 202 is patterned to form a cavity 138 which exposes the underlying gate mask 126 (See FIG. 8B), while the lithographic mask 136 of the second semiconductor device 204 is not patterned and thus preserved (see FIGS. 8C and 8D).

Figures 9, 10:
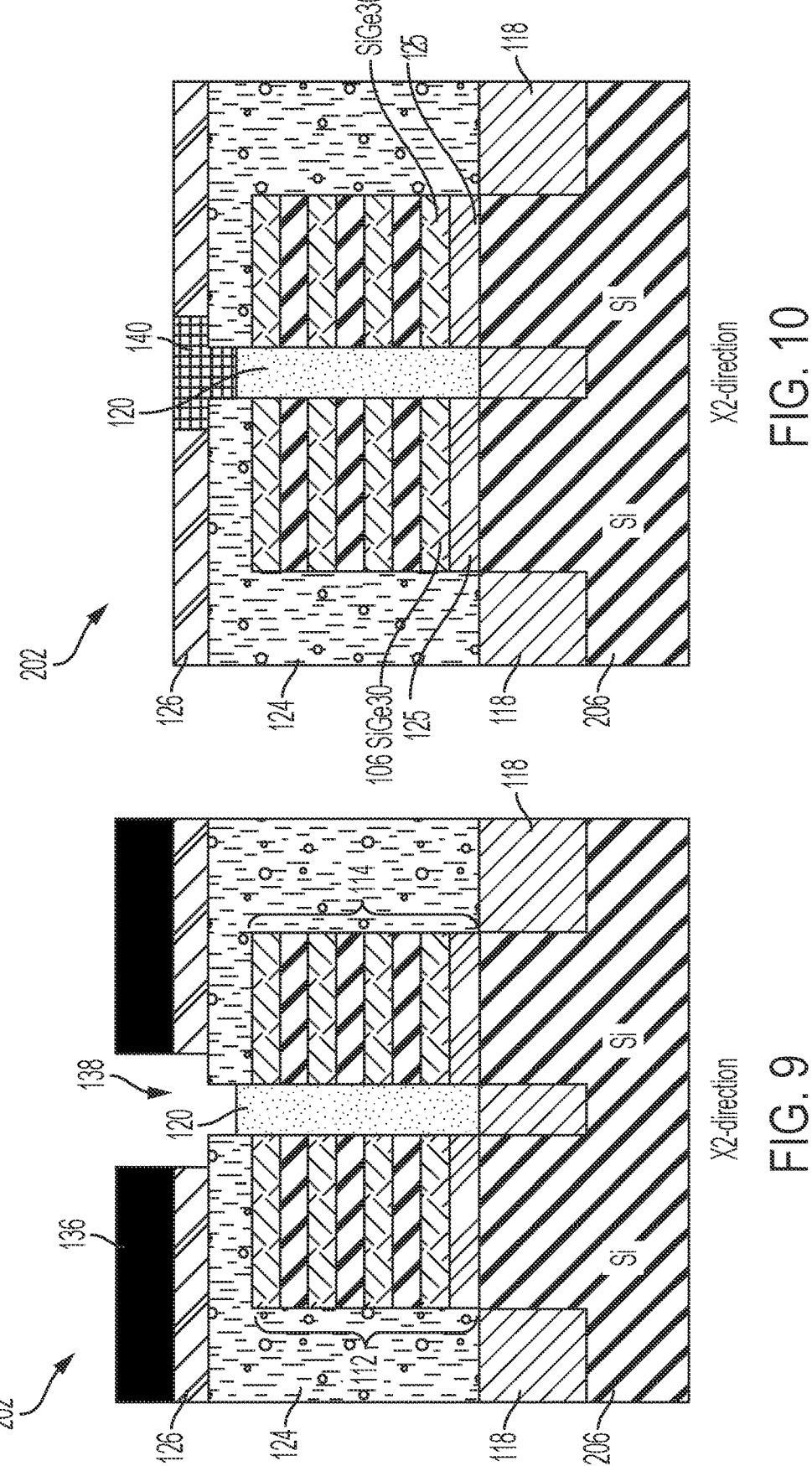
FIG. 9 depicts the second semiconductor device shown in FIG. 8B following various fabrication processes.
FIG. 10 depicts the second semiconductor device shown in FIG. 9 following various fabrication processes.

Turning to FIG. 9, the first semiconductor device 202 is illustrated after partially etching the exposed portion of the gate mask 126 to increase the size of the cavity 138 and partially recessing the upper portion of the isolation wall 120. According to one or more non-limiting embodiments, a RIE process can be performed to partially recess the isolation wall 120 below the upper surface of the PC gate 124.

Turning to FIG. 10, the first semiconductor device 202 is illustrated after filling the cavity 138 with a sacrificial filler material 140. In one or more non-limiting embodiments of the invention, the cavity 138 can be overfilled with the sacrificial filler material 140 and a CMP process can be performed to recess the lithographic mask 136 until stopping on the upper surface of the gate mask 126. Accordingly, the upper surface of the sacrificial filler material 140 is co-planar (e.g., flush) with the upper surface of the gate mask 126.

In one or more non-limiting embodiments of the invention, the sacrificial filler material 140 is formed from the same material as the PC gate 124. For example, the sacrificial filler material 140 can be formed from aSi when the PC gate 124 is formed from aSI. In this manner, a common etching chemistry can be used to remove both the sacrificial filler material 140 and the PC gate 124 during a single etching process.

Figures 11, 12A:
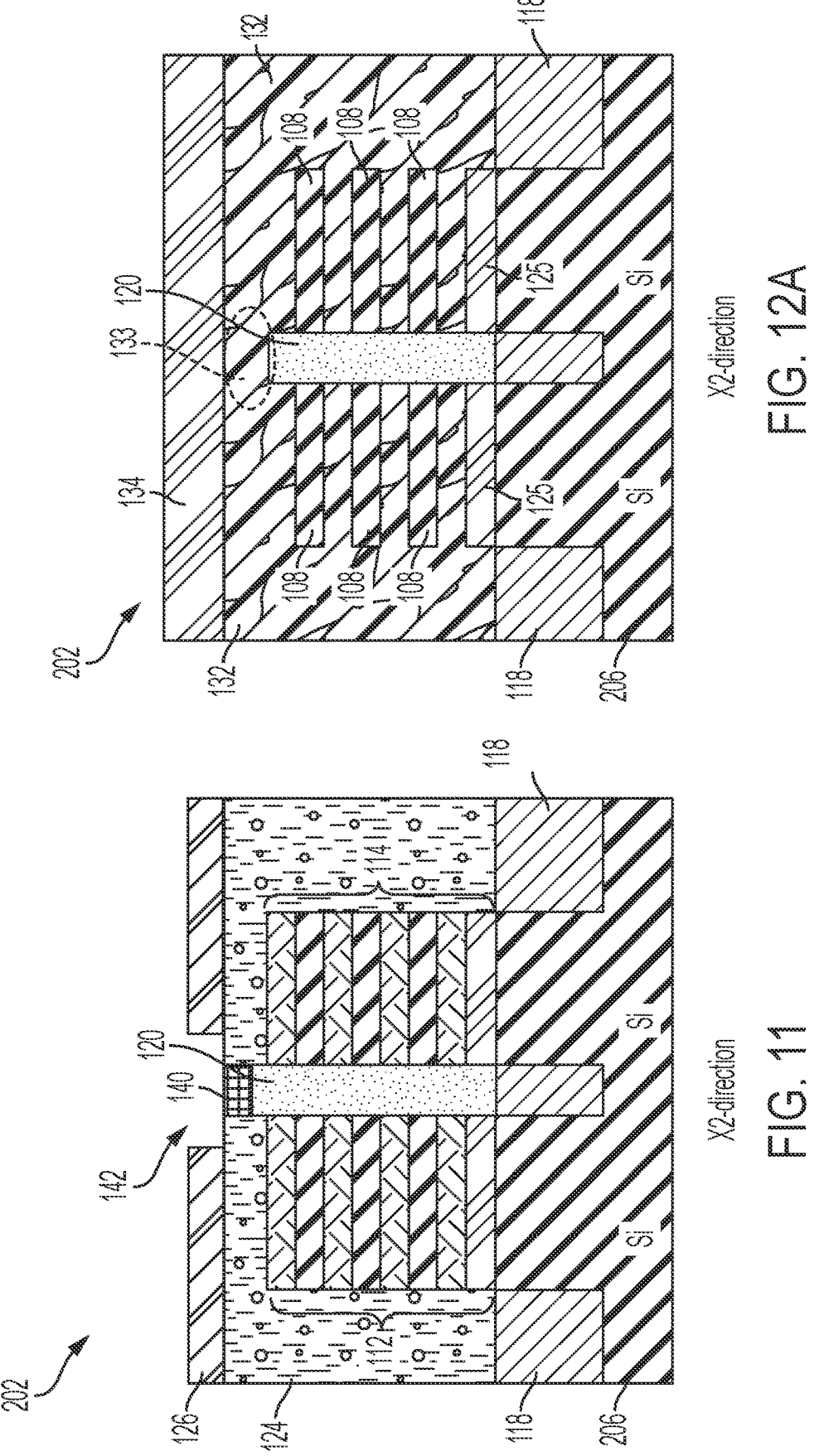
FIG. 11 depicts the second semiconductor device shown in FIG. 10 following various fabrication processes.
FIG. 12A depicts the second semiconductor device shown in FIG. 11 in the first orientation following various fabrication processes.

Referring now to FIG. 11, the first semiconductor device 202 is illustrated after removing a portion of the sacrificial filler material 140 to form an opening 142 in the gate mask 126. The opening 142 allows access to both the sacrificial filler material 140 and the PC gate 124. Accordingly, the sacrificial filler material 140 can be removed along with the PC gate 124 when performing a RMG process to replace the PC gate 124 with a metal gate 132 as described herein.

Figures 12B, 12C:
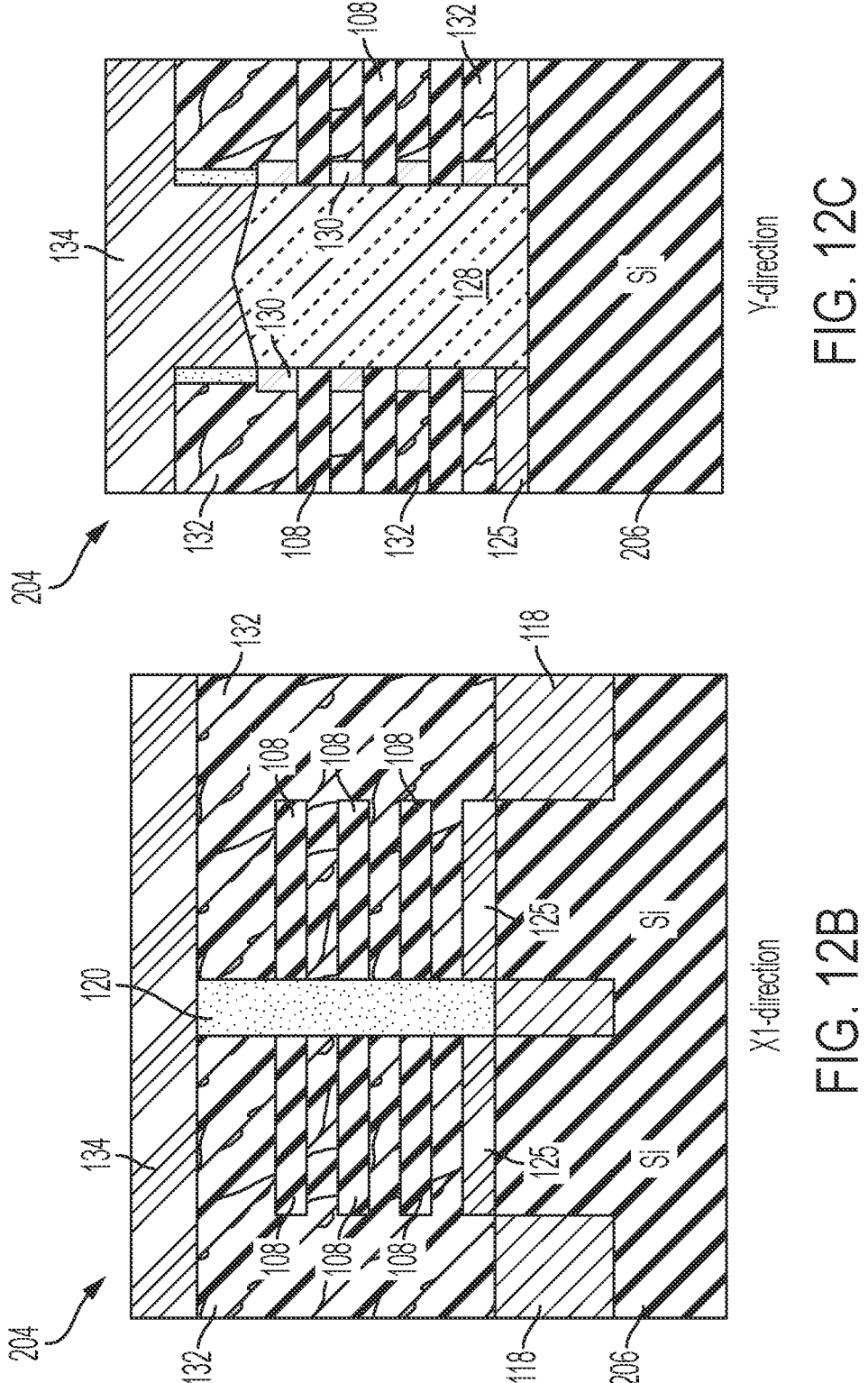
FIG. 12B depicts the first semiconductor device shown in FIG. 10 in the first orientation following the various fabrication processes shown in FIG. 12A.
FIG. 12C depicts the first semiconductor device shown in FIG. 11 in the second orientation following the various fabrication processes shown in FIG. 12A.

Referring to FIGS. 12A, 12B and 12C, the first semiconductor device 202 is illustrated following completion of a RMG process. The same RMG process described with reference to FIGS. 7A and 7B can be applied to the first semiconductor device 202. Therefore, the details of the RMG process will not be repeated for the sake of brevity.

As shown in FIG. 12A, the sacrificial filler material 140 facilitates formation of the isolation wall 120 such that it extends continuously from the wall base to the wall upper surface, but stops before reaching and contact the gate ILD 134. Accordingly, a shared gate region 133 is formed between the upper surface of the isolation wall, the upper surface of the conductive gate 132, and the gate ILD 134. In this manner, the first and second nanosheet fins 112 and 114

((i.e., the first and second stacks of nanosheet channels 108) of the first semiconductor device 202 can share the same metal gate 132.

As shown in FIGS. 12B and 12C, the preserved lithographic mask 136 of the second semiconductor device 204 (see FIGS. 8C and 8D) allows performing the CT cut, and results in the isolation wall 120 separating the metal gate 132 into two gate portions 132a and 132b or two individual gates. In this manner, the first semiconductor device 202 is fabricated with an isolation wall 120 that allows the first and second nanosheet fins 112 and 114 (i.e., the first and second stacks of nanosheet channels 108) to share the same metal gate 132, while the second semiconductor device 202 is fabricated with an isolation wall 120 that "cuts" the metal gate 132 into two gate portions 132a and 132b so that the first and second nanosheet fins 112 and 114 (i.e., the first and second stacks of nanosheet channels 108) of the second semiconductor device 204 can be controlled independently from one another.

Figures 13, 14:
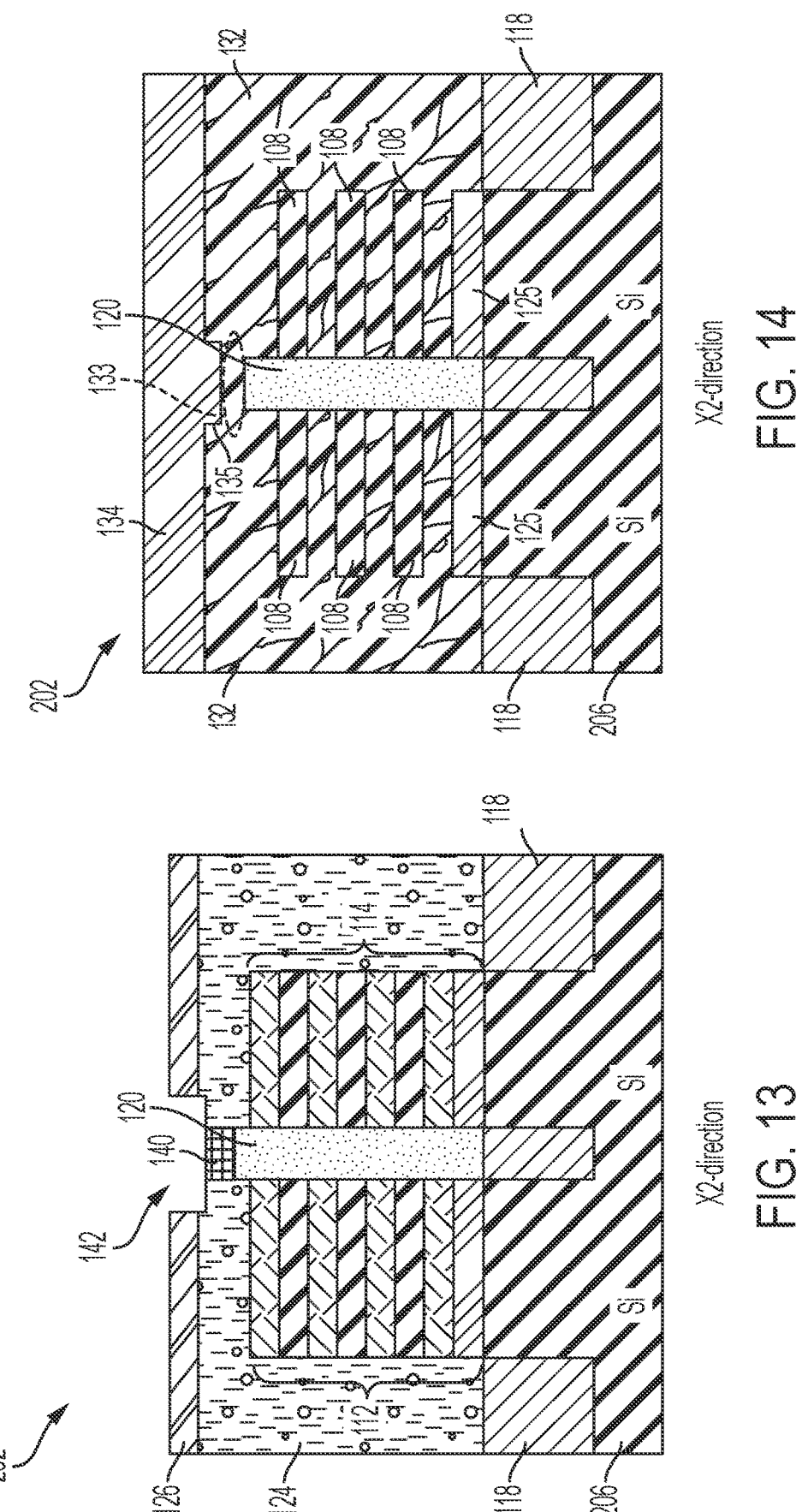
FIG. 13 depicts the second semiconductor device shown in FIG. 10 following various fabrication processes.
FIG. 14 depicts the second semiconductor device shown in FIG. 13 following various fabrication processes.

With reference now to FIG. 13, the first semiconductor device 202 is shown undergoing a "reverse CT cut" process according to another non-limiting embodiment of the invention. In this example, the opening 142 is extended into the sacrificial gate 124, which also partially recesses the sacrificial filler material 140. The pattern results in the formation of an ILD protrusion 135 that extends from the gate ILD 134 toward the upper surface of the isolation wall 120. Accordingly, the shared gate region 133 (i.e., the distance between the gate ILD 134 and the isolation wall 120) is reduced, as shown in FIG. 14.

Figures 15, 16:
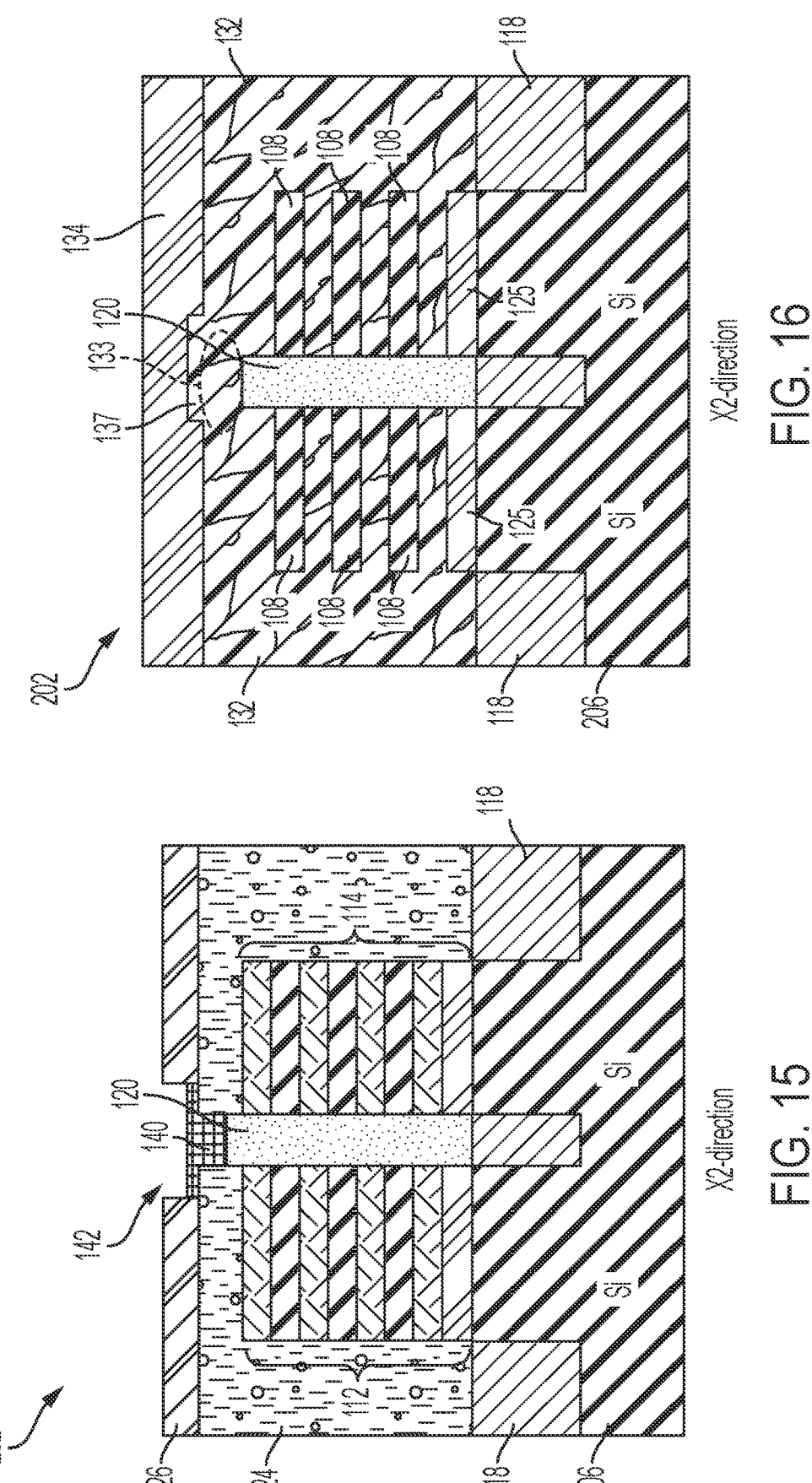
FIG. 15 depicts the second semiconductor device shown in FIG. 10 following various fabrication processes.
FIG. 16 depicts the second semiconductor device shown in FIG. 13 following various fabrication processes.

With reference now to FIG. 15, the first semiconductor device 202 is shown undergoing a "reverse CT cut" process according to another non-limiting embodiment of the invention. In this example, the hardmask 126 is partially etched to form an opening 142 that exposes the sacrificial filler material 140 covering the underlying sacrificial gate 124. The pattern results in the formation of a gate protrusion 137 which extends into the ILD 134 and increases the shared gate region 133 (i.e., the distance between the gate ILD 134 and the isolation wall 120) as shown in FIG. 16.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop (i.e., the second element remains).

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As used herein, "p-type" refers to the addition of impurities to an intrinsic semiconductor that creates deficiencies of valence electrons. In a silicon-containing substrate, examples of p-type dopants, i.e., impurities, include but are not limited to, boron, aluminum, gallium, and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabrication a semiconductor device, the method comprising:
    forming a stack of semiconductor nanosheets on a semiconductor substrate;
    performing a nanosheet fin reveal cut process that etches the stack of semiconductor nanosheets to from a first nanosheet fin and a second nanosheet fin, the first and second nanosheet fins separated by one another by a distance defining an isolation region;
    forming an isolation wall in the isolation region, the isolation wall extending continuously from a wall based contacting the semiconductor substrate to an opposing wall upper surface;
    forming an electrically conductive gate stack that surrounds the first nanosheet fin, the second nanosheet fin, and the isolation wall; and
    forming a gate interlayer dielectric (ILD) on an upper surface the electrically conductive gate stack such that the wall upper surface contacts the gate ILD.

2. The method of claim 1, wherein the wall upper surface is completely beneath the gate ILD.

3. The method of claim 2, wherein performing the nanosheet fin reveal cut process comprises:
    depositing a lithographic mask on an upper surface of the stack of semiconductor nanosheets;
    patterning the lithographic mask to form mask elements which define an opening therebetween that exposes a portion of the underlying stack of semiconductor nanosheets; and
    etching the exposed portion of the stack of semiconductor nanosheets until reaching the semiconductor substrate to form the isolation region.

4. The method of claim 3, wherein forming the isolation wall comprises:
    filling the isolation region with a dielectric material such that the dielectric material reaches an upper surface of the mask elements; and
    removing the mask elements while maintaining the dielectric material such that the remaining dielectric material defines the isolation wall.

5. The method of claim 4, wherein a height of the isolation wall is defined by a combination of a height of the first and second nanosheets along with the height of the mask elements prior to removing the mask elements.

6. The method of claim 4, wherein the isolation wall includes a protrusion that extends above an upper surface of the first and second nanosheet fins.

7. The method of claim 6, wherein forming the electrically conductive gate stack comprises:
    forming a sacrificial gate stack that covers the first nanosheet stack, the second nanosheet stack, and the protrusion of the isolation wall;
    performing a planarization process so that an upper surface of the sacrificial gate stack is co-planar with respect to the wall upper surface; and
    performing a replacement metal gate (RMG) process that replaces the sacrificial gate stack with the electrically conductive gate stack.

8. A method of fabricating a semiconductor device, the method comprising:
    forming a stack of semiconductor nanosheets on a semiconductor substrate;
    performing a nanosheet fin reveal cut process that etches the stack of semiconductor nanosheets to from a first nanosheet fin and a second nanosheet fin, the first and second nanosheet fins separated by one another by a distance defining an isolation region;
    forming an isolation wall in the isolation region, the isolation wall extending continuously from a wall based contacting the semiconductor substrate to an opposing wall upper surface;
    forming a sacrificial gate stack that surrounds the first nanosheet fin, the second nanosheet fin, and the isolation wall;
    etching a portion of the sacrificial gate stack and the isolation wall such a wall upper surface is below an upper surface of the sacrificial gate stack; and
    replacing the sacrificial gate stack with an electrically conductive gate stack, the electrically conductive gate stack including a shared gate region between the wall upper surface and an upper surface of the electrically conductive gate.

9. The method of claim 8, further comprising forming a gate interlayer dielectric (ILD) on an upper surface the electrically conductive gate stack.

10. The method of claim 9, wherein the etching further comprises:
    depositing a hard mask on an upper surface of the sacrificial gate stack and patterning the hard mask to form an opening that exposes a portion of the underlying sacrificial gate;
    performing a second etching process that removes a portion of the sacrificial gate stack to form a cavity that exposes the wall upper surface; and
    depositing a sacrificial filler material that completely fills the cavity and completely fills the opening.

11. The method of claim 10, wherein the etching further comprises:
    depositing a hard mask on an upper surface of the sacrificial gate and patterning the hard mask to form an opening that extends into the underlying sacrificial gate stack and exposes the wall upper surface; and
    depositing a sacrificial filler material that fills the cavity and the opening.

12. The method of claim 11, wherein replacing the sacrificial gate stack with the electrically conductive gate stack forms a gate cavity in the electrically conductive gate defined by the opening that extends into the previously sacrificial gate stack.

13. The method of claim 12, wherein forming a gate ILD includes deposing an ILD material on an upper surface the electrically conductive gate stack that fills the gate cavity to form an ILD protrusion that extends into the electrically conductive gate stack, and wherein the shared gate region between the wall upper surface and the ILD protrusion.

14. The method of claim 13, wherein the etching further comprises:

depositing a hard mask on an upper surface of the sacrificial gate stack and patterning the hard mask to form an opening that exposes a portion of the underlying sacrificial gate stack;

performing a second etching process that removes a portion of the sacrificial gate stack to form a cavity that exposes the wall upper surface; and depositing a sacrificial filler material that completely fills the cavity and partially fills the opening.

15. The method of claim 14, wherein replacing the sacrificial gate stack with the electrically conductive gate stack forms a gate protrusion that extends above the upper surface of the electrically conductive gate stack.

16. The method of claim 15, wherein forming the gate ILD includes deposing an ILD material on the upper surface the electrically conductive gate stack such that the gate protrusion extends into the gate ILD.

17. A semiconductor device comprising:

a first stack of nanosheet channels on a semiconductor substrate and a second stack of nanosheet channels on the semiconductor substrate;

an isolation wall interposed between the first stack of nanosheet channels and the second stack of nanosheet channels, the isolation wall separating the first and second stacks of nanosheet channels and extending continuously from a wall based contacting the semiconductor substrate to an opposing wall upper surface;

an electrically conductive gate stack that surrounds the first stack of nanosheet channels, the second stack of nanosheet channels, and the isolation wall; and a gate interlayer dielectric (ILD) on an upper surface the electrically conductive gate stack and contacting the wall upper surface of the isolation wall.

18. The semiconductor device of claim 17, wherein the wall upper surface is completely beneath the gate ILD.

19. The semiconductor device of claim 18, wherein the isolation wall includes a protrusion that extends above an upper surface of the first and second stacks of nanosheet channels.

20. The semiconductor device of claim 19, wherein the wall upper surface is coplanar with the upper surface the electrically conductive gate stack.

\* \* \* \* \*